(12) United States Patent
Koo et al.

(10) Patent No.: US 8,126,587 B2
(45) Date of Patent: Feb. 28, 2012

(54) APPARATUS FOR RECOGNIZING AND PROCESSING INFORMATION OF ELECTRONIC PARTS

(75) Inventors: Ja-Hyun Koo, Seongnam-si (KR); Man-Hee Lee, Seongnam-si (KR); Sun-Jeong Kang, Seongnam-si (KR)

(73) Assignee: Samsung Techwin Co., Ltd., Changwon-si (KR)

( * ) Notice: Subject to any disclaimer, the term of this patent is extended or adjusted under 35 U.S.C. 154(b) by 350 days.

(21) Appl. No.: 12/557,742

(22) Filed: Sep. 11, 2009

(65) Prior Publication Data

US 2010/0070067 A1 Mar. 18, 2010

(30) Foreign Application Priority Data

Sep. 18, 2008 (KR) ........................ 10-2008-0091473

(51) Int. Cl.
*G06F 19/00* (2011.01)
*H05K 3/30* (2006.01)
*H01R 43/20* (2006.01)
*B65B 21/02* (2006.01)
*B65B 69/00* (2006.01)
*B65G 65/04* (2006.01)
*B65G 65/34* (2006.01)

(52) U.S. Cl. ........ 700/192; 700/110; 700/112; 700/114; 700/186; 700/193; 29/833; 29/846; 29/876; 29/895.2; 348/94; 348/95; 414/416.03; 414/416.11

(58) Field of Classification Search ................... 700/111, 700/112, 114, 169, 186, 192, 193; 29/833, 29/846, 876, 895.2; 348/94–95; 414/416.03, 416.11

See application file for complete search history.

(56) References Cited

U.S. PATENT DOCUMENTS

| 5,331,406 | A | * | 7/1994 | Fishbaine et al. | ............. | 356/621 |
| 5,852,869 | A | * | 12/1998 | Gieskes et al. | ................... | 29/834 |
| 6,118,538 | A | * | 9/2000 | Haugan et al. | ................. | 356/623 |
| 6,374,484 | B1 | * | 4/2002 | Yoshida et al. | ................. | 29/740 |
| 6,496,248 | B2 | * | 12/2002 | Tanaka | ............. | 355/72 |
| 6,692,214 | B1 | * | 2/2004 | Shida et al. | ............. | 414/416.03 |
| 7,367,117 | B2 | * | 5/2008 | Yoshii et al. | ..................... | 29/833 |
| 7,957,822 | B2 | * | 6/2011 | Morita | ............................ | 700/56 |
| 2002/0035783 | A1 | * | 3/2002 | Kawada | ............................ | 29/833 |
| 2005/0128344 | A1 | * | 6/2005 | Suhara et al. | ................. | 348/370 |
| 2010/0171824 | A1 | * | 7/2010 | Utsumi | ..................... | 348/95 |

FOREIGN PATENT DOCUMENTS

| CN | 1578618 A | 2/2005 |
| CN | 1800775 A | 7/2006 |
| JP | 04-296032 A | 10/1992 |
| JP | 05-129401 A | 5/1993 |
| KR | 1998-084764 A | 12/1998 |
| KR | 1020000056739 A | 9/2000 |
| KR | 1020070045057 A | 5/2007 |
| KR | 1020070122031 A | 12/2007 |

* cited by examiner

*Primary Examiner* — Ramesh Patel
(74) *Attorney, Agent, or Firm* — Drinker Biddle & Reath LLP

(57) ABSTRACT

An apparatus for recognizing and processing information of electronic parts includes a seating unit on which electronic parts are seated and aligned and a part information processing unit disposed adjacent to the seating unit. The part information processing unit is configured to align the electronic parts using the seating unit, recognize a recognition surface of the electronic parts, obtaining part information of the recognized surface, and store the obtained part information.

20 Claims, 10 Drawing Sheets

APPARATUS FOR RECOGNIZING AND PROCESSING INFORMATION OF ELECTRONIC PARTS

CROSS-REFERENCE TO RELATED APPLICATION

This application claims the priority benefit of Korean Patent Application No. 2008-0091473, filed Sep. 18, 2008, which is hereby incorporated herein by reference in its entirety.

BACKGROUND

1. Field of the Invention

The present invention relates to an apparatus for recognizing and processing information of electronic parts, and more particularly, to an apparatus for recognizing and processing information of electronic parts capable of obtaining and storing part information thereof.

2. Description of the Related Art

Typically, an electronic device which operates under externally received power includes a printed circuit board having electronic parts installed thereon. The electronic parts may include components such as semiconductor chips. Each of the components may include an electronic circuit for performing a predetermined electronic function.

The semiconductor chips may be manufactured by sequentially or selectively performing a plurality of semiconductor manufacturing processes such as diffusion, deposition, exposure, cleansing, and etching on a semiconductor wafer. The semiconductor chips manufactured as described above may be mounted on the printed circuit board of the electronic device through a packaging apparatus such as an electronic part mounter. The electronic part mounter (e.g., a surface mounter, component mounter, or chip mounter) may function to mount an electronic part such as a semiconductor chip or resistor on a desired position of the printed circuit board.

A conventional chip mounter may include a main body on which a circuit board is moved to a desired location, a chip supply unit mounted on the main body, a head unit disposed at the main body and sequentially using vacuum suction to grasp electronic parts supplied from the chip supply unit and moving the electronic parts to arbitrary desired positions on the circuit board for mounting, and a controller for inputting and storing information of the supplied electronic parts and controlling operation of the head unit.

The chip supply unit typically includes a feeder and a reel mounted on the feeder. The reel typically has a certain length of electronic part supply tape wound thereon. In addition, electronic parts such as semiconductor chips are typically aligned and loaded on the electronic part supply tape at predetermined intervals.

The head unit typically includes a nozzle for using vacuum suction to grasp the electronic parts loaded on the electronic part supply tape and an X-Y moving body for moving the nozzle to a desired position on the circuit board.

Information of the electronic parts loaded on the feeder and supplied into the main body of the conventional chip mounter is typically input into the controller. The reason the conventional chip mounter's controller typically inputs and stores information of the electronic parts is that the controller typically must precisely recognize a positional relationship between a moving position of the X-Y moving body and a mounting position of the electronic parts on the circuit board.

Conventionally, in order to input the information of the electronic parts, a man-machine interface (MMI) in which an operator directly inputs the information into the chip mounter has been used. Therefore, in the MMI, the operator typically inputs the information of the electronic parts on the basis of listed specifications of the electronic parts such as the sizes, lead numbers, pitches, thicknesses, and so on. However, when the specification is not available or not provided from a manufacturer of the electronic parts, the operator may need to measure the sizes, lead numbers, pitches, thicknesses, etc., of the electronic parts visually or using measurement devices such as vernier calipers, etc., and manually input them into the controller.

As a result, due to the difficulty to precisely input and store the information of the electronic parts, the input information may need to be repeatedly corrected so that the chip mounter can precisely mount the electronic parts on arbitrary desired positions of the circuit board.

SUMMARY

In various embodiments, an apparatus for recognizing and processing information of electronic parts may include a seating unit on which electronic parts are seated and aligned and a part information processing unit disposed adjacent to the seating unit. The part information processing unit may be configured to align the electronic parts using the seating unit, recognize a recognition surface of the electronic parts, obtaining part information of the recognized surface, and store the obtained part information.

In various embodiments, an apparatus for recognizing and processing information of electronic parts may include a seating unit configured to seat and align an electronic part thereon. The seating unit may include a support plate having an X-axis guide rail. The seating unit may also include an X-axis adjustment plate installed on the support plate and having an X-axis guide groove fitted onto the X-axis guide rail and a Y-axis guide rail formed at an upper end of the X-axis adjustment plate. The X-axis adjustment plate may be configured to slide along an X-axis. The seating unit may further include a Y-axis adjustment plate installed on the X-axis adjustment plate and having a Y-axis guide groove fitted onto the Y-axis guide rail. The Y-axis adjustment plate may be configured to slide along a Y-axis. The seating unit may also include a vertical support body installed on the Y-axis adjustment plate and a Z-axis adjustment plate configured to vertically slide along a Z-axis at a side of the vertical support body. In addition, the seating unit may include a part seating plate disposed at an upper end of the Z-axis adjustment plate and configured to rotate about the Z-axis and a first rotary shaft disposed between the part seating plate and the Z-axis adjustment plate and configured to rotate the part seating plate. The apparatus for recognizing and processing information of electronic parts may also include a part information processing unit disposed adjacent to the seating unit. The part information processing unit may include a first sensor disposed adjacent to the seating unit on which the electronic part is seated and aligned. The first sensor may be configured to recognize a plane recognition surface of the electronic part seated on the part seating plate and obtain first part information thereof. The plane recognition surface may represent a size of an upper or lower surface of the electronic part. The part information processing unit may also include a second sensor disposed adjacent to the seating unit on which the electronic part is seated and aligned. The second sensor may be configured to recognize a side recognition surface of the electronic part seated on the part seating plate and obtain second part information thereof. The side recognition surface may represent a side thickness of the electronic part. The part information processing unit may further include a controller configured to align the electronic part using the seating unit, receive the first and second part information from the first and second sensors, collect the first and second part information, and group and store the collected first and second part information.

In various embodiments, an apparatus for recognizing and processing information of electronic parts may include a seating unit having a vacuum suction nozzle. The vacuum suction nozzle may have a vacuum suction orifice configured to use vacuum suction provided by an external vacuum supply to grasp an electronic part. The seating unit may also have an X-Y-Z position mover configured to vary a position of the vacuum suction nozzle along X-, Y-, and Z-axes and a rotary shaft installed is between the vacuum suction nozzle and the X-Y-Z position mover and configured to rotate the vacuum suction nozzle. The seating unit may further include a driver configured to vary a position of the X-Y-Z position mover and rotate the second rotary shaft. The apparatus for recognizing and processing information of electronic parts may also include a part information processing unit disposed in operational proximity to the seating unit. The part information processing unit may be configured to recognize a recognition surface of the electronic part seated on the seating unit, obtain part information of the recognized surface, and store the obtained part information.

In various embodiments, an apparatus for recognizing and processing information of electronic parts may include a plurality of seating units. Each of the plurality of seating units may be configured to seat an electronic part thereon. The apparatus for recognizing and processing information of electronic parts may also include a part information processing unit disposed in operational proximity to the plurality of seating units. The part information processing unit may be configured to recognize a recognition surface of the electronic part seated on a selected one of the plurality of seating units, obtain part information of the recognized surface, and store the obtained part information. The apparatus for recognizing and processing information of electronic parts may further include a rotary body connected to the part information processing unit and configured to rotate the part information processing unit to be operationally coupled with the selected one of the plurality of seating units.

DETAILED DESCRIPTION

Figure 1:
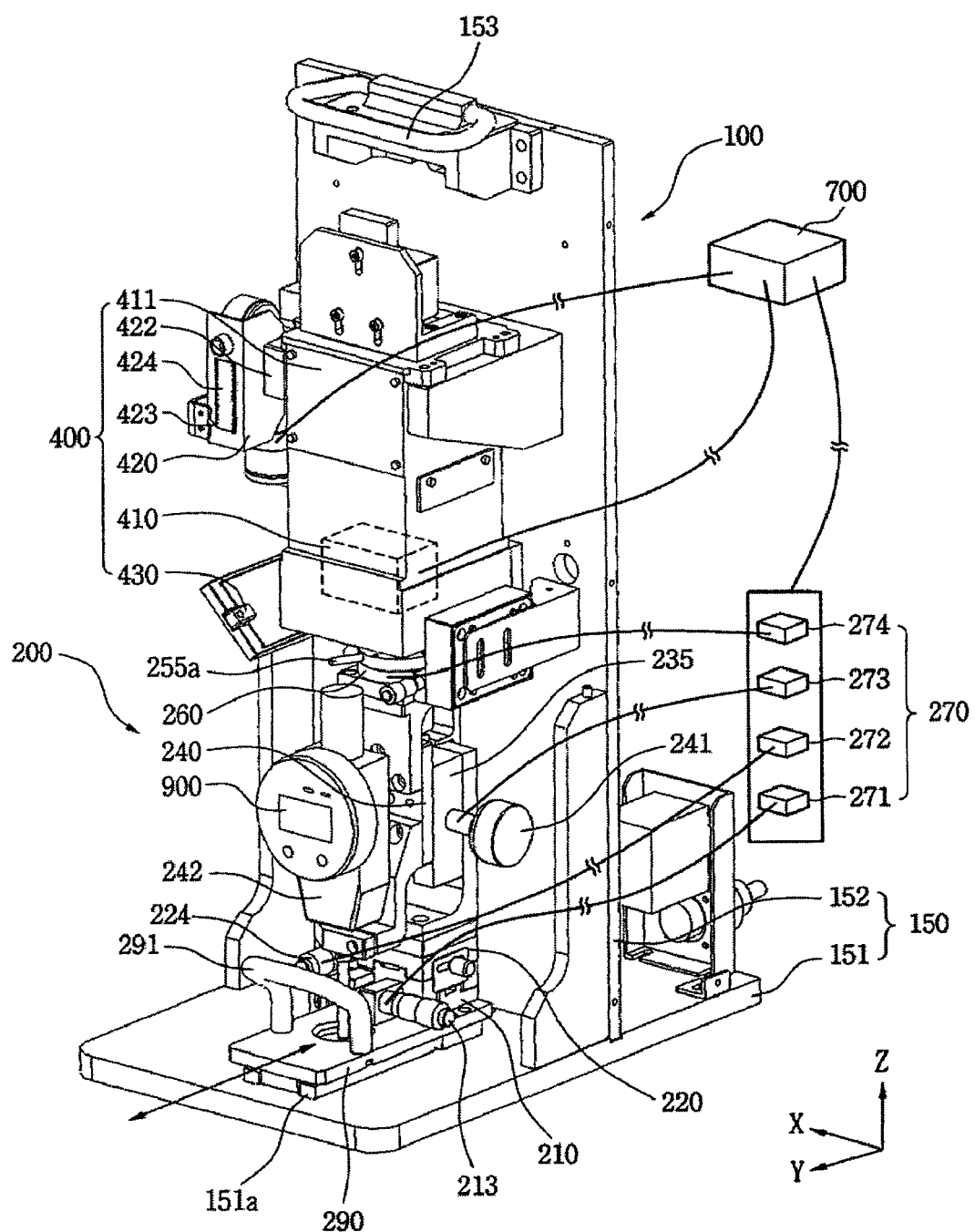
FIG. 1 is a perspective view of an exemplary apparatus for recognizing and processing information of electronic parts.
Figure 2:
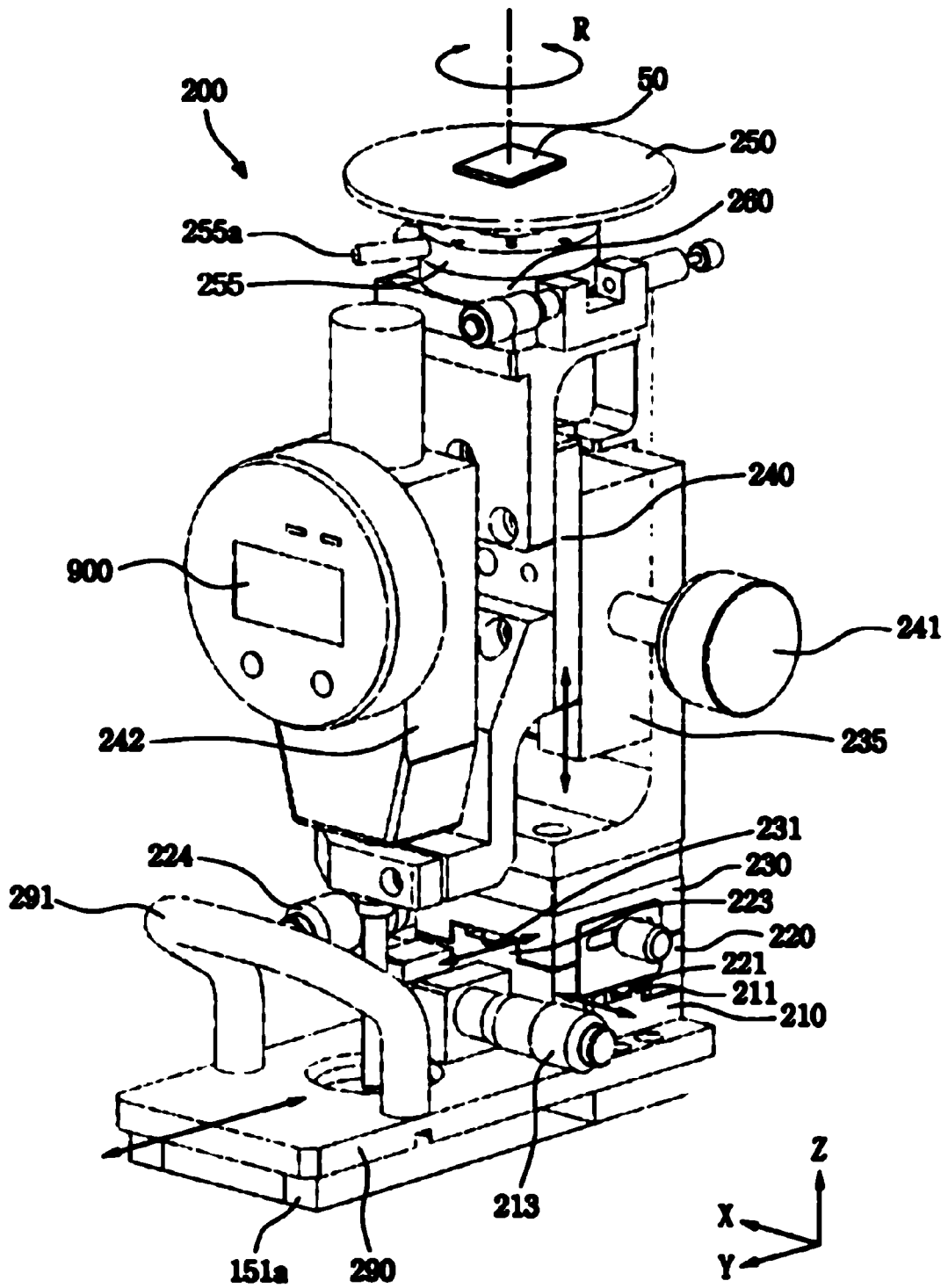
FIG. 2 is a perspective view of an exemplary main seating unit of FIG. 1.
Figure 3:
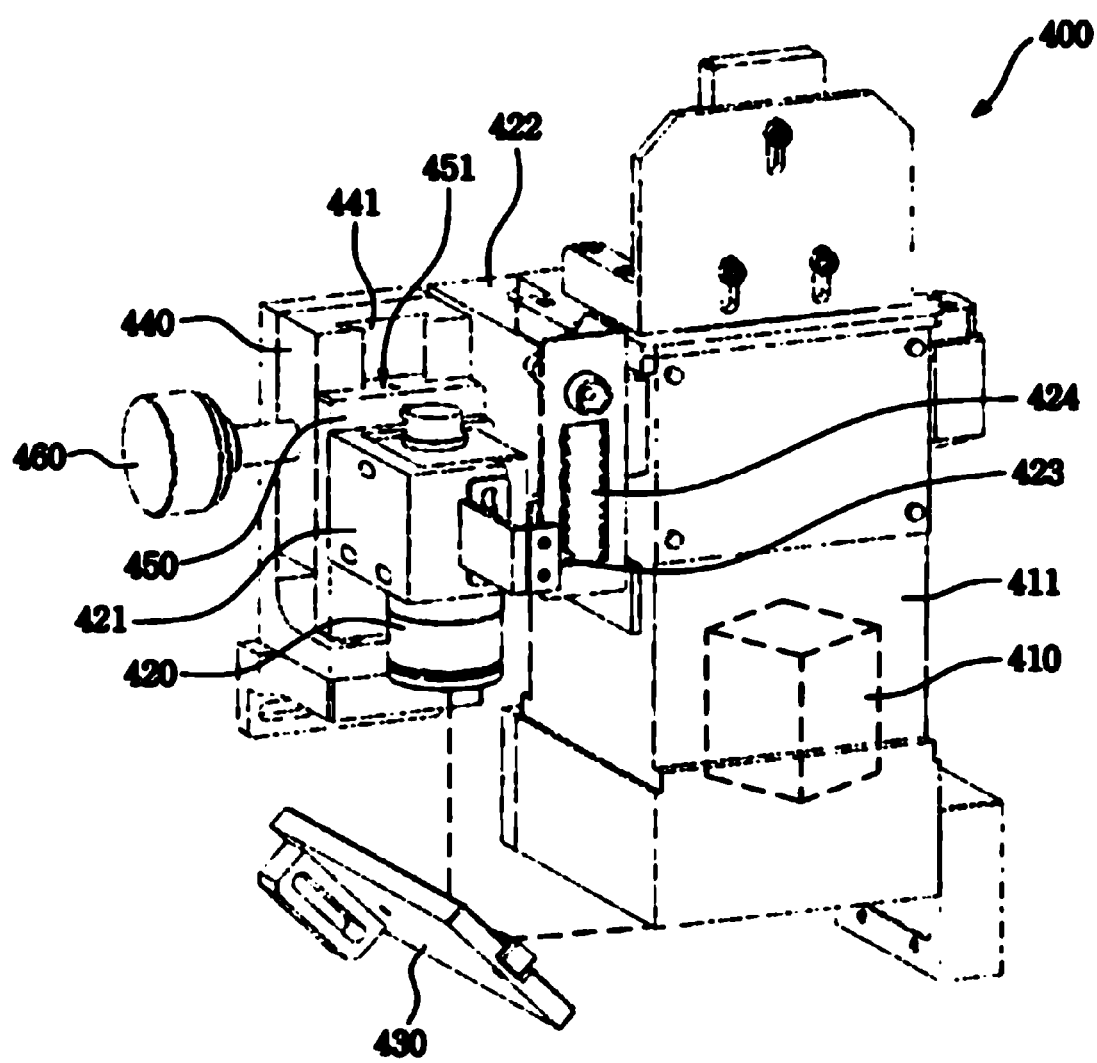
FIG. 3 is a perspective view of an exemplary part information processing unit of FIG. 1.
Figure 4:
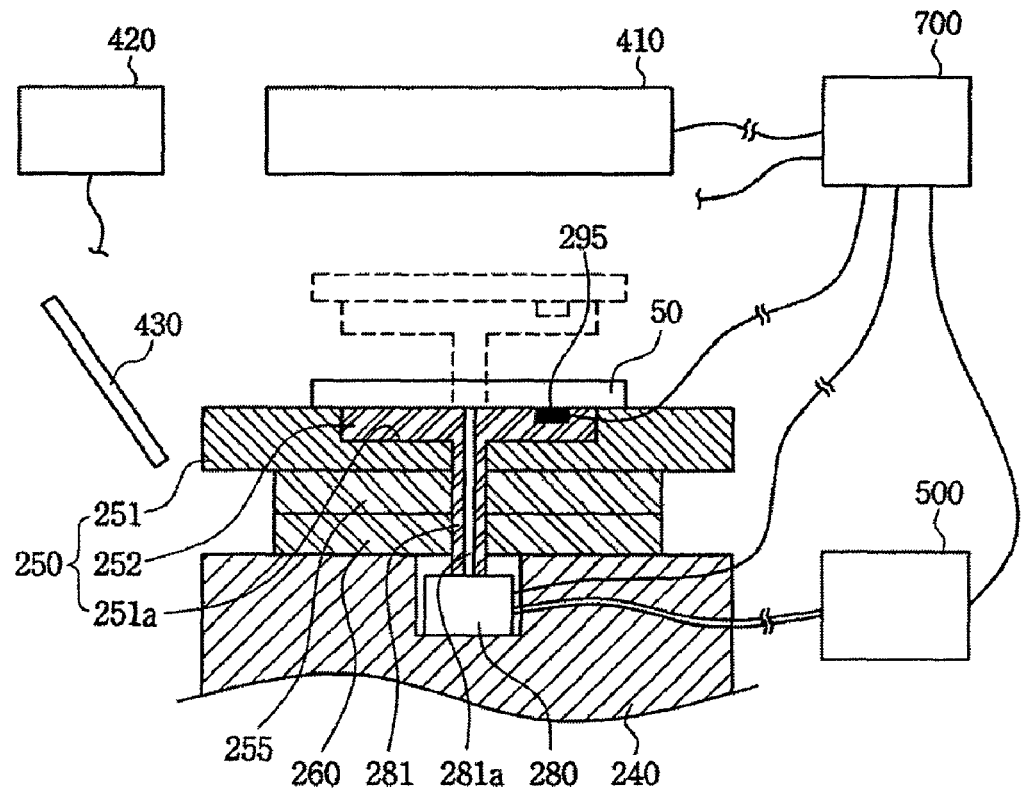
FIG. 4 is a cross-sectional view of another exemplary part information processing unit and an exemplary part seating plate of FIG. 2 disposed thereunder.
Figure 5:
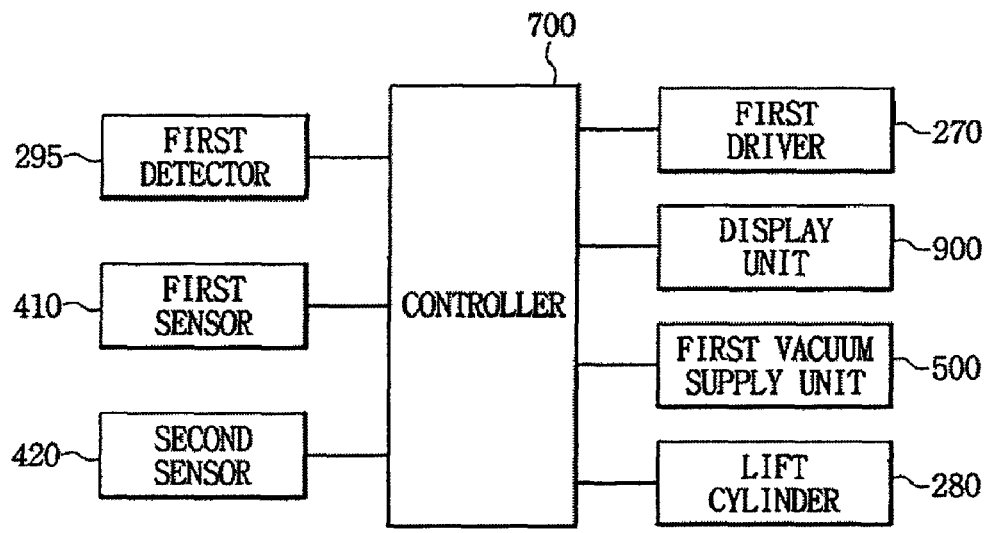
FIG. 5 is a block diagram showing an exemplary operational relationship between the main seating unit and the part information processing unit using the controller.
Figure 6:
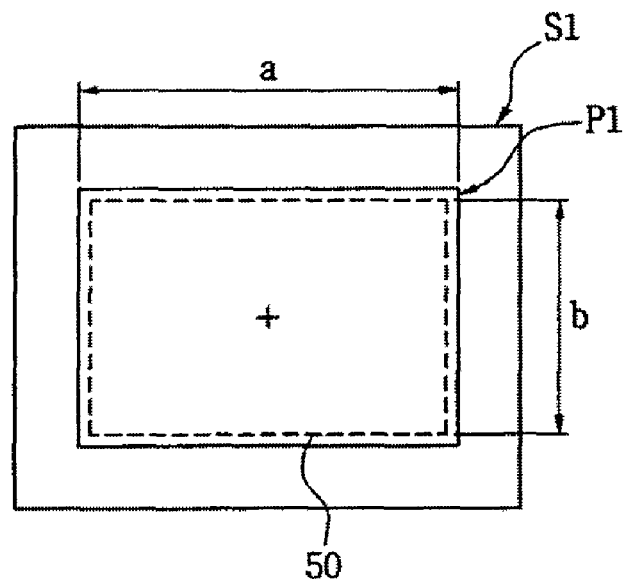
FIG. 6 is a top view showing an exemplary first recognition surface recognized by a first sensor of FIG. 1.
Figure 7:
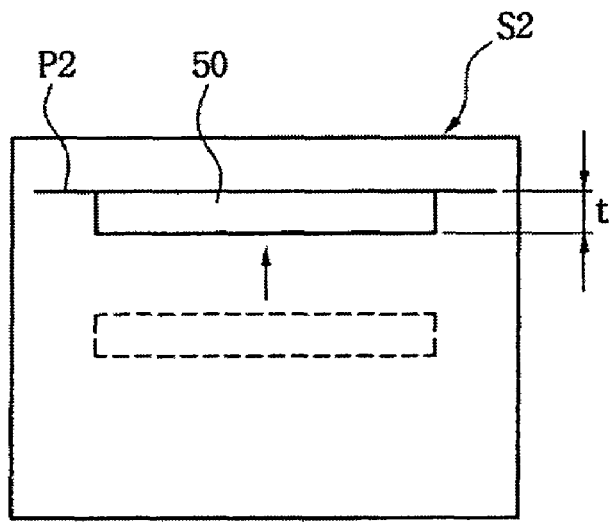
FIG. 7 is a side view showing an exemplary second recognition surface recognized by a second sensor of FIG. 1.
Figure 8:
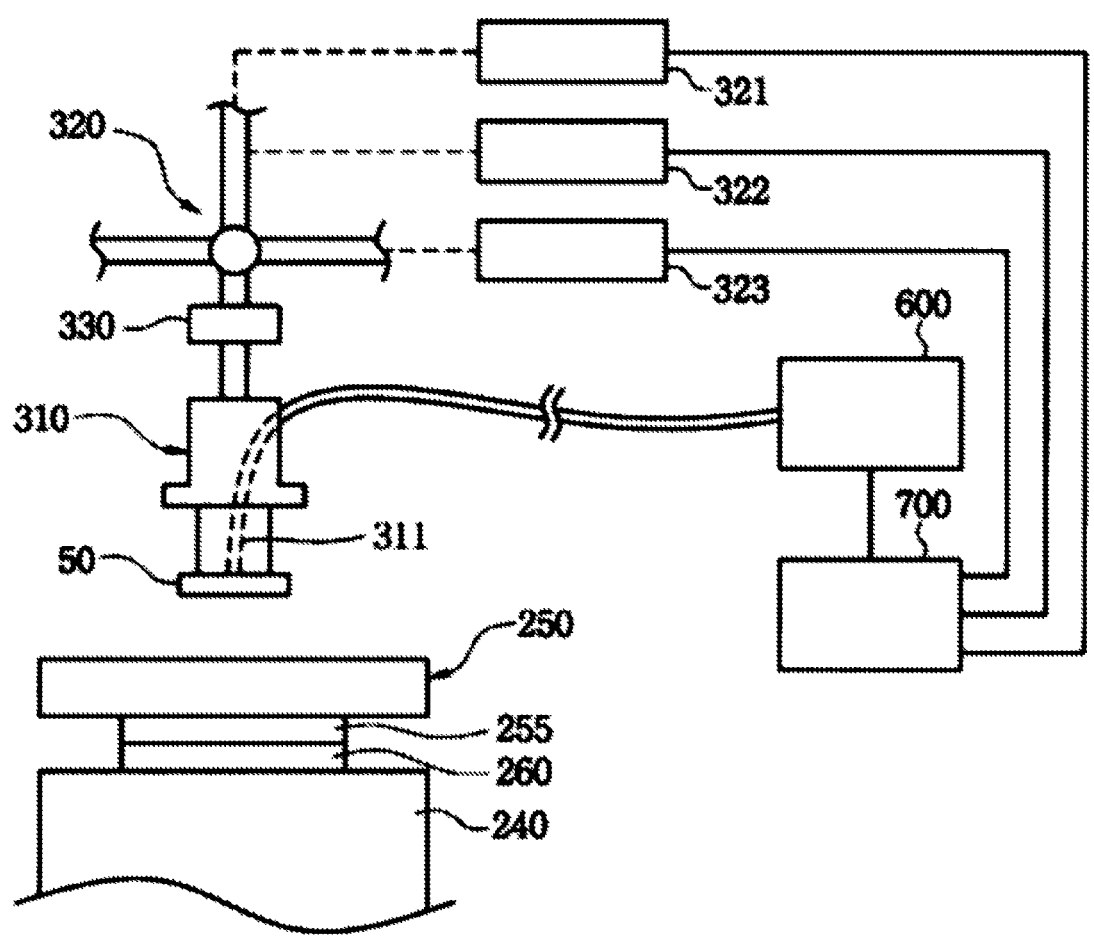
FIG. 8 is a view showing an operation of an exemplary vacuum suction nozzle for seating an electronic part on the main seating unit of FIG. 2.

FIG. 1 is a perspective view of an exemplary apparatus for recognizing and processing information of electronic parts. The exemplary apparatus includes a main seating unit 200 and a part information processing unit 400. FIG. 2 is a perspective view of the exemplary main seating unit 200 of FIG. 1. FIG. 3 is a perspective view of the exemplary part information processing unit 400 of FIG. 1. FIG. 4 is a cross-sectional view of another exemplary part information processing unit and an exemplary part seating plate 250 of FIG. 2 disposed thereunder. FIG. 5 is a block diagram showing an exemplary operational relationship between the main seating unit 200 and the part information processing unit 400 using the controller 700. FIG. 6 is a top view showing an exemplary first recognition surface recognized by a first sensor 410 of FIG. 1. FIG. 7 is a side view showing an exemplary second recognition surface recognized by a second sensor 420 of FIG. 1. FIG. 8 is a view showing an operation of an exemplary vacuum suction nozzle 310 for seating an electronic part 50 on the main seating unit 200 of FIG. 2.

As illustrated in FIG. 2, an electronic part 50 may be seated on the main seating unit 200. The part information processing unit 400 may be positioned adjacent to, or in operational proximity to, the main seating unit 200 and configured to obtain information of the electronic part 50. For example, the part information processing unit 400 may be positioned above the main seating unit 200.

The main seating unit 200 may be disposed on a support body 150 provided at a main body 100. As shown in FIG. 1, the support body 150 may include a plate-shaped lower body 151 and a vertical body 152. The vertical body 152 may vertically extend from the lower body 151 to a certain length sufficient to support components of the exemplary apparatus installed thereon. A foldable handle 153 may be installed at an upper end of the vertical body 152. The part information processing unit 400 may also be disposed on the vertical body 152. The main seating unit 200 may be disposed on the lower body 151 below the part information processing unit 400. In addition, a pair of Y-axis guide rails 151a may be installed on the lower body 151 and configured for sliding the main seating unit 200 along a Y-axis.

Hereinafter, constitution of the main seating unit 200 will be described with reference to FIG. 2. The main seating unit 200 may include a movable plate 290 disposed at the Y-axis guide rail 151a and configured to slide along the Y-axis. The movable plate 290 may have a gripper 291 disposed at a front end of the movable plate 290. A support plate 210 may be installed on the movable plate 290. An X-axis guide rail 211 may be disposed at an upper end of the support plate 210. An X-axis adjustment plate 220 may be installed on the support plate 210 using an X-axis guide groove 221 fitted onto the X-axis guide rail 211 and configured to slide the X-axis adjustment plate 200 along an X-axis. A Y-axis guide rail 223 may be formed at an upper end of the X-axis adjustment plate 220. A Y-axis adjustment plate 230 may be installed on the X-axis adjustment plate 220 using a Y-axis guide groove 231 fitted onto the Y-axis guide rail 223 and configured to slide the Y-axis adjustment plate 230 along a Y-axis.

A vertical support body 235 may be installed on the Y-axis adjustment plate 230. A Z-axis adjustment plate 240 may be disposed at a side portion of the vertical support body 235 and configured to slide along a Z-axis relative to the vertical support body 235. A part seating plate 250 may be disposed at an upper end of the Z-axis adjustment plate 240 and rotatable about the Z-axis or an R-axis parallel with the Z-axis. In addition, a stationary body 242 may be fixed to a front end of the Z-axis adjustment plate 240, and a display unit 900 may be mounted on a front end of the stationary body 242.

The X-axis adjustment plate 220 may have a rotatable X-axis knob 213. The X-axis knob 213 may be configured such that as the X-axis knob 213 rotates, the X-axis adjustment plate 220 moves along the X-axis guide rail 211. In addition, the X-axis knob 213 may be meshed, or coordinated, with the X-axis guide rail 211. The X-axis knob 213 and the X-axis adjustment plate 220 may be configured such that as the X-axis knob 213 rotates in a clockwise direction, the X-axis adjustment plate 220 moves along the X-axis guide rail 211 in one linear direction, whereas when the X-axis knob 213 rotates in a counter-clockwise direction, the X-axis adjustment plate 220 moves along the X-axis guide rail 211 in an opposite linear direction.

The Y-axis adjustment plate 230 may have a rotatable Y-axis knob 224, and the vertical support body 235 may have a rotatable Z-axis knob 241. The Y-axis knob 224 may be configured with respect to the Y-axis adjustment plate 230, and the Z-axis knob 241 may be configured with respect to the Z-axis adjustment plate 240, in a similar manner as the X-axis knob 213 is configured with respect to the X-axis adjustment plate 220. Accordingly, the Y-axis adjustment plate 230 and the Z-axis adjustment plate 240 may slide in a same manner as the X-axis adjustment plate 220. The Y-axis knob 224 and the Y-axis adjustment plate 230 may be configured such that as the Y-axis knob 224 rotates in a clockwise direction, the Y-axis adjustment plate 230 moves along the Y-axis guide rail 223 in one linear direction, whereas when the Y-axis knob 224 rotates in a counter-clockwise direction, the Y-axis adjustment plate 230 moves along the Y-axis guide rail 223 in an opposite linear direction. The Z-axis knob 241 and the Z-axis adjustment plate 240 may be configured such that as the Z-axis knob 241 rotates in a clockwise direction, the Z-axis adjustment plate 240 moves along the Z-axis in one linear direction, whereas when the Z-axis knob 241 rotates in a counter-clockwise direction, the Z-axis adjustment plate 240 moves along the Z-axis in an opposite linear direction.

The part seating plate 250 may be disposed on or coupled with the Z-axis adjustment plate 240 and configured to be rotatable about the R-axis or Z-axis. A first rotary shaft 260 may be installed at an upper end of the Z-axis adjustment plate 240, and a rotary connecting body 255 may be disposed at a lower center of the part seating plate 250 to be rotatably connected to the first rotary shaft 260. In addition, a rotary handle 255a may project from an outer periphery of the rotary connecting body 255 to a certain length sufficient to be externally grasped, pushed, or pulled to cause the part seating plate 250 to rotate when an external rotational force is applied to the rotary handle 255a.

Referring again to FIG. 1, the part information processing unit 400 may be fixed to a surface of the vertical body 152 to be located on or over the main seating unit 200. The part information processing unit 400 may include a first sensor 410 disposed on or over the part seating plate 250, a second sensor 420 disposed to a side of the first sensor 410, and a controller 700 which may be electrically connected to or communicatively coupled with the first and second sensors 410 and 420. The first sensor 410 and/or the second sensor 420 may use cameras to obtain images. As shown in FIG. 1, the first sensor 410 and the second sensor 420 may be disposed in parallel with respect to the vertical body 152.

As illustrated in FIGS. 1 to 3, the first sensor 410 may be installed at a first case 411 fixed to a surface of the vertical body 152 to obtain an image of an upper portion of the part seating plate 250 (see FIG. 2). The second sensor 420 may be installed to a side of the first case 411. The second sensor 420 may be installed in a second case 421 and be configured to be lifted or lowered along the Z-axis. A reflection mirror 430 may be disposed under the second sensor 420 and fixed to a side of the vertical body 152 such that the second sensor 420 may obtain an image of a side portion of the part seating plate 250 and/or an electronic part 50 seated thereon.

In addition, a connection bracket 422 may be configured to fix a connection body 440 to a side portion of the first case 411. A guide groove 441 may be formed in the connection body 440 along the Z-axis. A lift plate 450 may be installed at the connection body 440 and configured to slide along the Z-axis. The second case 421 may be fixed to the lift plate 450. A guide projection 451 may project from the lift plate 450 to be inserted into the guide groove 441 and slide therealong. In this way, the lift plate 450 may slide relative to the connection body 440 along the Z-axis using the guide projection 451 inserted into the guide groove 441. In addition, a lift knob 460 may be installed at the connection body 440 to raise or lower the lift plate 450. The lift knob 460 may be configured with respect to the lift plate 450 in a similar manner as the X-axis knob 213 is configured with respect to the X-axis adjustment plate 220 illustrated in FIG. 2. Accordingly, as the lift knob 460 rotates, the lift plate 450 may be raised or lowered in the same manner as the X-axis adjustment plate 220 moves along the X-axis as the X-axis knob 213 rotates.

An indication member 423 may be installed at the second case 421. The indication member 423 may have a sharp or pointed end or other means for indicating a position, such as a dot or horizontal mark. A scale 424 may be installed at the connection bracket 422 such that the end or other means for indicating a position of the indication member 423 may visually show a lift (e.g., Z-axis) adjustment position of the second case 421 using the scale 424.

Hereinafter, functions of the first and second sensors 410 and 420 will be described.

As illustrated in FIG. 4, the first sensor 410 may recognize a first recognition surface (see FIG. 6) of the electronic part 50 seated on the part seating plate 250. The first sensor 410 may obtain first part information of the first recognition surface. The electronic part 50 may include a semiconductor chip having a plurality of leads and/or balls. The first recognition surface may include a two-dimensional plane recognition surface S1 of an upper surface of the electronic part 50. The first recognition surface may also include a two-dimensional recognition surface of a lower surface of the electronic part 50. The two-dimensional plane recognition surface S1 may include a plane image. The first part information may include a size of the electronic part 50 represented by a length a and/or a width b, a length and/or width of the leads (not shown), a size of the balls (not shown), or the like. After the first sensor 410 obtains the first part information from the first recognition surface of the electronic part 50, the first sensor 410 may transmit a signal (e.g., an electrical signal) representative of the first part information to the controller 700.

The second sensor 420 may recognize a second recognition surface (see FIG. 7) of the electronic part 50 seated on the part seating plate 250. The second sensor 420 may obtain second part information of the second recognition surface. As shown in FIG. 7, the second recognition surface may include a side recognition surface S2 of a side surface of the electronic part 50. The reflection mirror 430 may be disposed to a side of the part seating plate 250 such that the second sensor 420 may recognize the second recognition surface of the electronic part 50 by a reflection of an image thereof on the reflection mirror 430. Therefore, the reflection mirror 430 may form an image exposure path through which a side surface of the electronic part 50 is exposed to the second sensor 420. The second part information obtained by the second sensor 420 may include a thickness t of the electronic part 50, a thicknesses of the leads, a thickness of the balls, or the like. After the second sensor 420 obtains the second part information of the second recognition surface of the electronic part 50, the second sensor 420 may transmit a signal (e.g., an electrical signal) representative of the second part information to the controller 700.

The controller 700 may receive the first and second part information from the first and second sensors 410 and 420 to collect the part information, and group and store the collected part information into various groups. In addition, the controller 700 may receive the first and second part information from the first and second sensors 410 and 420 for a plurality of different electronic parts 50 at different times, calculate an average of the information received for the plurality of different electronic parts 50, collect the averaged first and second part information of the plurality of electronic parts 50, and group and store the collected averaged first and second part information. The controller 700 may compare the collected part information of the plurality of electronic parts 50 to determine whether the part information corresponding to one electronic part 50 is the same as the part information corresponding to another electronic part 50 or not within a reference error range, and group and/or store the part information accordingly. The reference error range may typically be a small percentage of the compared information, such as less than 1%, 2%, 5%, 10%, 20%, or 30% of a size or thickness of the electronic part 50. The controller 700 may be electrically connected to or communicatively coupled with the display unit 900 for visually displaying the first and second part information externally.

As shown in FIG. 1, the main seating unit 200 may further include a first driver 270 for driving the X-axis adjustment plate 220, the Y-axis adjustment plate 230, the Z-axis adjustment plate 240, and the part seating plate 250 rotatable about the R-axis. The first driver 270 may include an X-axis drive motor 271 configured to receive an operation signal (e.g., electrical signal) and responsively move the X-axis adjustment plate 220 along the X-axis guide rail 211 of the support plate 210. Likewise, the first driver 270 may include a Y-axis drive motor 272 configured to receive an operation signal (e.g., an electrical signal) and responsively move the Y-axis adjustment plate 230 along the Y-axis guide rail 223. The first driver 270 may also include a Z-axis drive motor 273 configured to receive an operation signal (e.g., an electrical signal) and responsively move the Z-axis adjustment plate 240 along a Z-axis guide rail (not shown) formed at the vertical support body 235 along the Z-axis. Furthermore, the first driver 270 may include a first rotary motor 274 configured to receive an operation signal (e.g., an electrical signal) and responsively rotate the first rotary shaft 260. The first driver 270 may be electrically connected to or communicatively coupled with the controller 700 in order to receive an operation signal (e.g., an electrical signal) from the controller 700.

As shown in FIG. 1, the first driver 270 may extend to the exterior of the main seating unit 200. However, in other embodiments, the first driver 270 may be connected to and be configured to rotate the knobs 213, 224 and 241. In various embodiments, the first driver 270 receives operation signals (e.g., electrical signals) from the controller 700 and in response thereto, drives the X-, Y-, and Z-axis drive motors 271, 272 and 273 and the first rotary motor 274 such that the plates 220, 230, 240 and 250 may be individually and/or independently moved.

The controller 700 may operate the first driver 270 such that the first sensor 410's focus of the plane recognition surface S1 and the second sensor 420's focus of the side recognition surface S2 correspond to a predetermined focus. Furthermore, the controller 700 may operate the first driver 270 such that a seating position of the electronic part 50 corresponds to a predetermined alignment position. The controller 700 may operate the X-, Y-, and Z-axis drive motors 271, 272 and 273 and the first rotary motor 274 accordingly. As the X-, Y-, and Z-axis adjustment plates 271, 272 and 273 are moved, a position of the electronic part 50 may be varied in three-dimensions. As the part seating plate 250 is rotated, a rotation position of the electronic part 50 may be determined.

As shown in FIG. 4, the part seating plate 250 may include a main part seating plate body 251 having a seating groove 251a of a predetermined depth, a sub part seating plate body 252 seated in the seating groove 251a, a lift pin 281 connected to a lower surface and passing through the main part seating plate body 251, and a lift cylinder 280 electrically connected to or communicatively coupled with the controller 700 and configured to receive an operation signal (e.g., an electrical signal) from the controller 700 to lift the lift pin 281. The lift cylinder 280 may adjust a vertical position of the sub part seating plate body 252, and consequently the electronic part 50 seated thereon, along the Z-axis using the lift pin 281 such that a focus on the plane recognition surface S1 and a seating position of the electronic part 50 correspond to a predetermined focus and alignment position.

The electronic part 50 may be held in place (e.g., seated or grasped) on the part seating plate 250 and/or sub part seating plate body 252 using vacuum suction. The lift pin 281 may include a vacuum suction orifice 281a configured to supply the vacuum suction provided from a first vacuum supply unit 500. The first vacuum supply unit 500 may be operated by being electrically connected to or communicatively coupled with the controller 700 to receive an operation signal (e.g., an electrical signal) from the controller 700. The part seating plate 250 and/or sub part seating plate body 252 may further include a first detector 295 configured to detect seating of the electronic part 50 thereon. The first detector 295 may include a distance detector, an optical sensor, a laser sensor, or other means for detecting whether the electronic part 50 is seated on the part seating plate 50. The first detector 295 may transmit a signal (e.g., an electrical signal) representative of the seating to the controller 700. In response, the controller 700 may transmit an operation signal (e.g., an electrical signal) to the first driver 270. Accordingly, the controller 700 may control the apparatus for recognizing and processing information of the electronic part 50 to obtain and process the first and second part information when the electronic part 50 is seated on the sub part seating plate body 252, and not otherwise.

Hereinafter, operation of the apparatus for recognizing and processing information of an electronic part 50 will be described.

As illustrated in FIG. 2, the electronic part 50 may be seated on the part seating plate 250 of the main seating unit 200 manually by a user or by using a vacuum suction nozzle 310 as shown in FIG. 8. The vacuum suction nozzle 310 may function both to seat the electronic part 50 on the part seating plate 250 and extract the electronic part 50 therefrom. The controller 700 may operate a second vacuum supply portion 600 to provide vacuum suction in the vacuum suction orifice 311 of the vacuum suction nozzle 310 waiting at a predetermined position near the electronic part 50. Therefore, the electronic part 50 may be grasped using vacuum suction by the vacuum suction nozzle 310.

As illustrated in FIG. 8, the controller 700 may operate an X-Y-Z position mover 320 to move the vacuum suction nozzle 310 near or onto the part seating plate 250. The controller 700 may operate the X-Y-Z position mover 320 by sending operation signals (e.g., electrical signals) to a plurality of motors 321, 322, and 323 which may be configured to move the X-Y-Z position mover 320 along X-, Y-, and Z-axes. A second rotary shaft 330 may be installed between the vacuum suction nozzle 310 and the X-Y-Z position mover 320 and configured to rotate the vacuum suction nozzle 310 such that an electronic part 50 grasped by the vacuum suction nozzle 310 also rotates. A rotary motor may be coupled or integrated with the second rotary shaft 330 and configured to rotate the second rotary shaft 330 in response to an operation signal (e.g., electrical signal) received from the controller 700.

The controller 700 may control the vacuum suction nozzle 310 to release the vacuum suction formed in the vacuum suction orifice 311 such that the electronic part 50 may be seated on the part seating plate 250. As a result, the electronic part 50 seated on the part seating plate 250 may be exposed to the first and second sensors 410 and 420 shown in FIG. 1.

The first sensor 410 may obtain image information of the plane recognition surface S1 of the electronic part 50 as shown in FIG. 6. The second sensor 420 may obtain image information of the side recognition surface S2 of the electronic part 50 as shown in FIG. 7 through reflection by the reflection mirror 430. Using the image information obtained by the first and second sensors 410 and 420, the controller 700 may operate the first driver 270 to adjust positions of the X-, Y-, and Z-axis adjustment plates 220, 230, and 240 and the part seating plate 250 such that a focus of the plane and side recognition surfaces S1 and S2 correspond to a predetermined focus and a seating position of the electronic part 50 corresponds to predetermined alignment positions P1 and P2 as shown in FIGS. 6 and 7. The positions of the X-, Y-, and Z-axis adjustment plates 220, 230, and 240 may be adjusted by rotating the knobs 213, 224, and 241. Referring to FIG. 2, as the knobs 213, 224 and 241 are rotated, the X-, Y-, and Z-axis adjustment plates 220, 230 and 240 may be moved to a certain intended position and located thereat along X, Y and Z directions. In addition, the part seating plate 250 may be rotated, using the first rotary shaft 260, about the R-axis to a certain intended angle to locate the first rotary shaft 260 at a certain intended position.

The controller 700 may receive information of the plane recognition surface S1 and the side recognition surface S2 obtained from the first and second sensors 410 and 420 when the electronic part 50 seated on the part seating plate 250 arrives at the predetermined focus and alignment position. The controller 700 may obtain first part information of the electronic part 50 from the received plane recognition surface S1. The first part information may include a size of the electronic part 50 formed of a width a and a length b as shown in FIG. 6, the length of leads, the size of balls, or the like. The controller 700 may also obtain second part information such as the thickness t of the electronic part 50 from the received side recognition surface S2. The first part information and the second part information obtained by the controller 700 may be transmitted to the display unit 900 to be displayed externally.

After the first and second part information are obtained by the controller 700, the controller 700 may collect the first part information and the second part information as single part information. The controller 700 may also group and store the collected part information.

Hereinafter, a process for grouping collected part information will be described.

The controller 700 may collect part information for a plurality of electronic parts 50 as described above. The collected part information may include a size value and a thickness value for each of the plurality of electronic parts 50. The collected part information for the plurality of electronic parts 50 may be grouped into various groups of the same parts. A reference error range may be set in the controller 700 to be used as a parameter for comparing and grouping the collected part information. The reference error range may include a reference thickness applied to a measured thickness of the electronic part 50, and a reference size applied to a measured size of the electronic part 50. The controller 700 may perform comparisons to determine whether a plurality of stored part information is the same, or corresponds to the same electronic part 50. The controller 700 may group the same part information of the plurality of part information as a single group.

In addition, when the part information is compared, the controller 700 may determine whether the part information is included in the reference error range, and may group the part information as the same group when the part information is included in the reference error range.

Hereinafter, another exemplary apparatus for recognizing and processing information of an electronic part 50 will be described.

Figure 9:
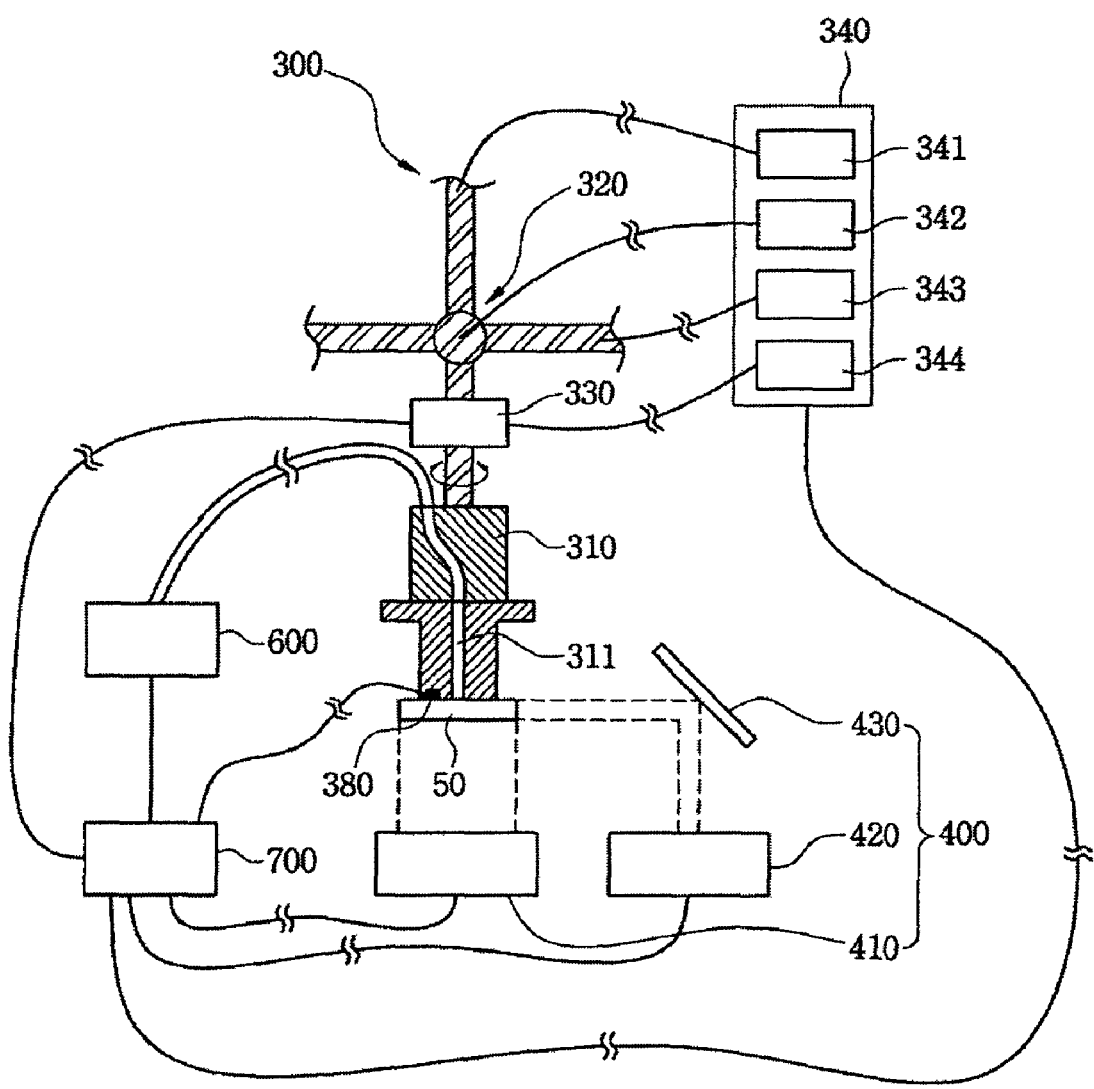
FIG. 9 is a view showing an exemplary sub seating unit.

FIG. 9 is a view showing an exemplary sub seating unit 300. The sub seating unit 300 includes an X-Y-Z position mover 320, a vacuum suction nozzle 310, a part information processing unit 400, a controller 700, and a second vacuum supply unit 600.

The vacuum suction nozzle 310 may include a vacuum suction orifice 311 configured to supply vacuum suction provided from the second vacuum supply unit 600. The vacuum suction nozzle 310 may grasp an electronic part 50 using the vacuum suction from the vacuum suction orifice 311. The X-Y-Z position mover 320 may vary a position of the vacuum suction nozzle 310 along X-, Y-, and Z-axes. A second rotary shaft 330 may be installed between the vacuum suction nozzle 310 and the X-Y-Z position mover 320 and configured to rotate the vacuum suction nozzle 310 such that an electronic part 50 grasped by the vacuum suction nozzle 310 also rotates. A second driver 340 may be configured to drive components of the sub seating unit 300 to cause a position of the X-Y-Z position mover 320 to be varied and the second rotary shaft 330 to be rotated in response to an operation signal (e.g., electrical signal) received from the controller 700.

The first sensor 410 may be disposed under or below a position of the vacuum suction nozzle 310 and the second sensor 420 may be disposed at or toward a side portion of the vacuum suction nozzle 310. The controller 700 may operate the second driver 340 such that the first sensor 410's focus of the plane recognition surface S1 and the second sensor 420's focus of the side recognition surface S2 correspond to a predetermined focus. Furthermore, the controller 700 may operate the second driver 340 such that a seating position of the electronic part 50 corresponds to a predetermined alignment position.

The second driver 340 may include first linear motor 341, second linear motor 342, and third linear motor 343 configured to move the X-Y-Z position mover 320 and the vacuum suction nozzle 310 along X-, Y-, and Z-axes. The second driver 340 may also include a second rotary motor 344 configured to rotate the second rotary shaft 330. The controller 700 may transmit an operation signal (e.g., electrical signal) to the first linear motor 341, the second linear motor 342, the third linear motor 343, and/or the second rotary motor 344 to control a spatial position of the vacuum suction nozzle 310 by operation of the X-Y-Z position mover 320 and a rotation position of the vacuum suction nozzle 310 by operation of the second rotary shaft 330.

The vacuum suction nozzle 310 may further include a second detector 380 configured to detect vacuum suction of the electronic part 50 and transmit a signal (e.g., an electrical signal) representative of the vacuum suction to the controller 700. The second detector 380 may include a distance detector, an optical sensor, a laser sensor, or other means for detecting whether the electronic part 50 is grasped by the vacuum suction nozzle 310.

In an example, an electronic part 50 may be waiting at a position near the vicinity of the sub seating unit 300. The vacuum suction nozzle 310 may grasp the electronic part 50 using vacuum suction formed in the vacuum suction orifice 311. The second detector 380 may then detect that the electronic part 50 has been grasped using vacuum suction and transmit a signal (e.g., an electrical signal) representative of the vacuum suction to the controller 700. The controller 700 may then cause the electronic part 50 to be moved to a predetermined focus and alignment position using the X-Y-Z position mover 320 and the second rotary shaft 330. When the electronic part 50 is at the predetermined focus and alignment position, the first and second sensors 410 and 420 may obtain first and second part information of the electronic part 50, and transmit a signal (e.g., an electrical signal) representative of the first and second part information to the controller 700. Then controller 700 may then collect the part information, and group and store the part information as described elsewhere herein. The controller 700 may be configured to only group and store the part information when the controller 700 has received the signal representative of the vacuum suction of the electronic part 50 from the second detector 380.

Hereinafter, an apparatus for recognizing and processing information of an electronic part in accordance with another exemplary embodiment of the present invention will be described.

Figure 10:
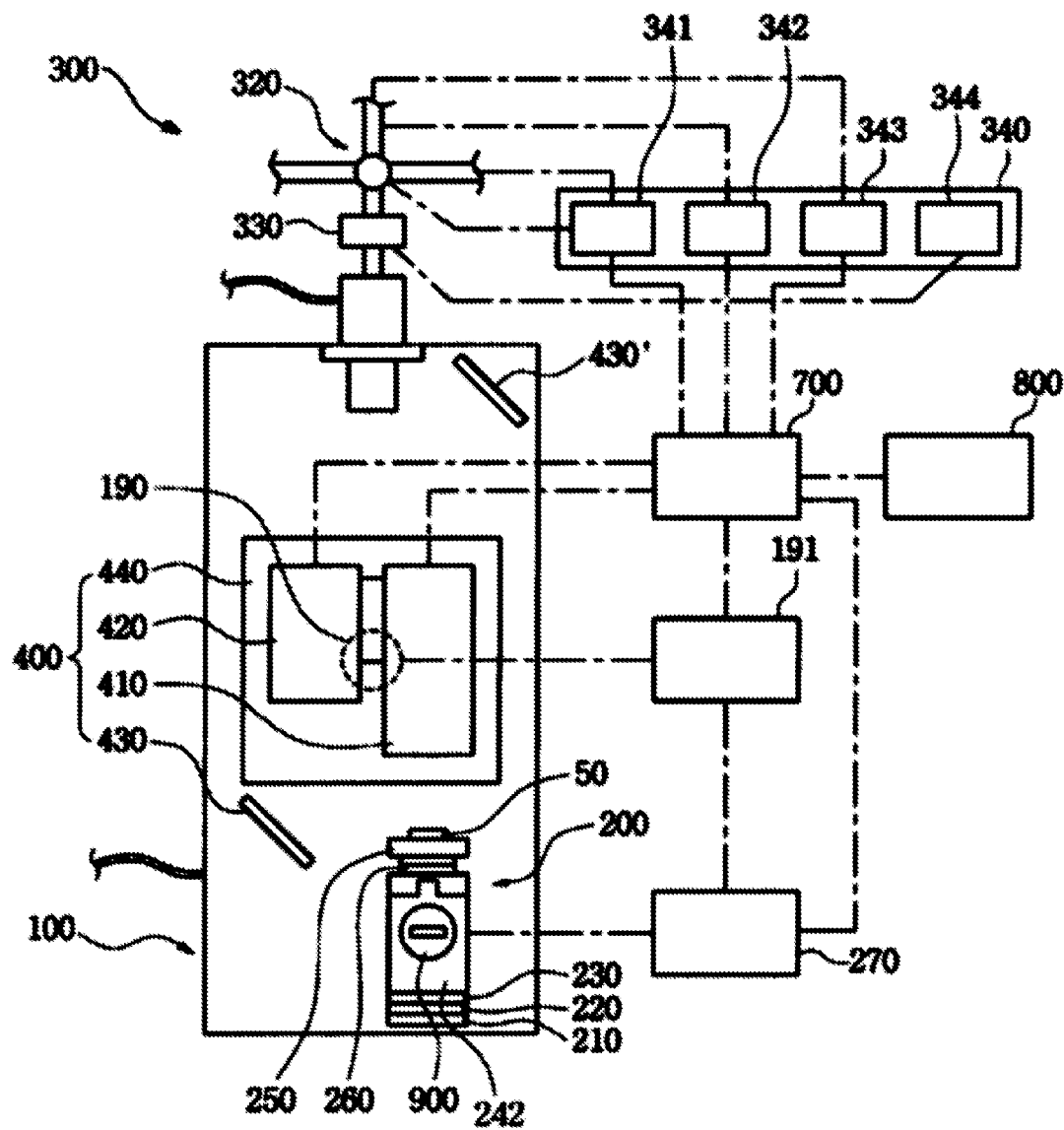
FIG. 10 is a view of another exemplary apparatus for recognizing and processing information of electronic parts.
Figure 11:
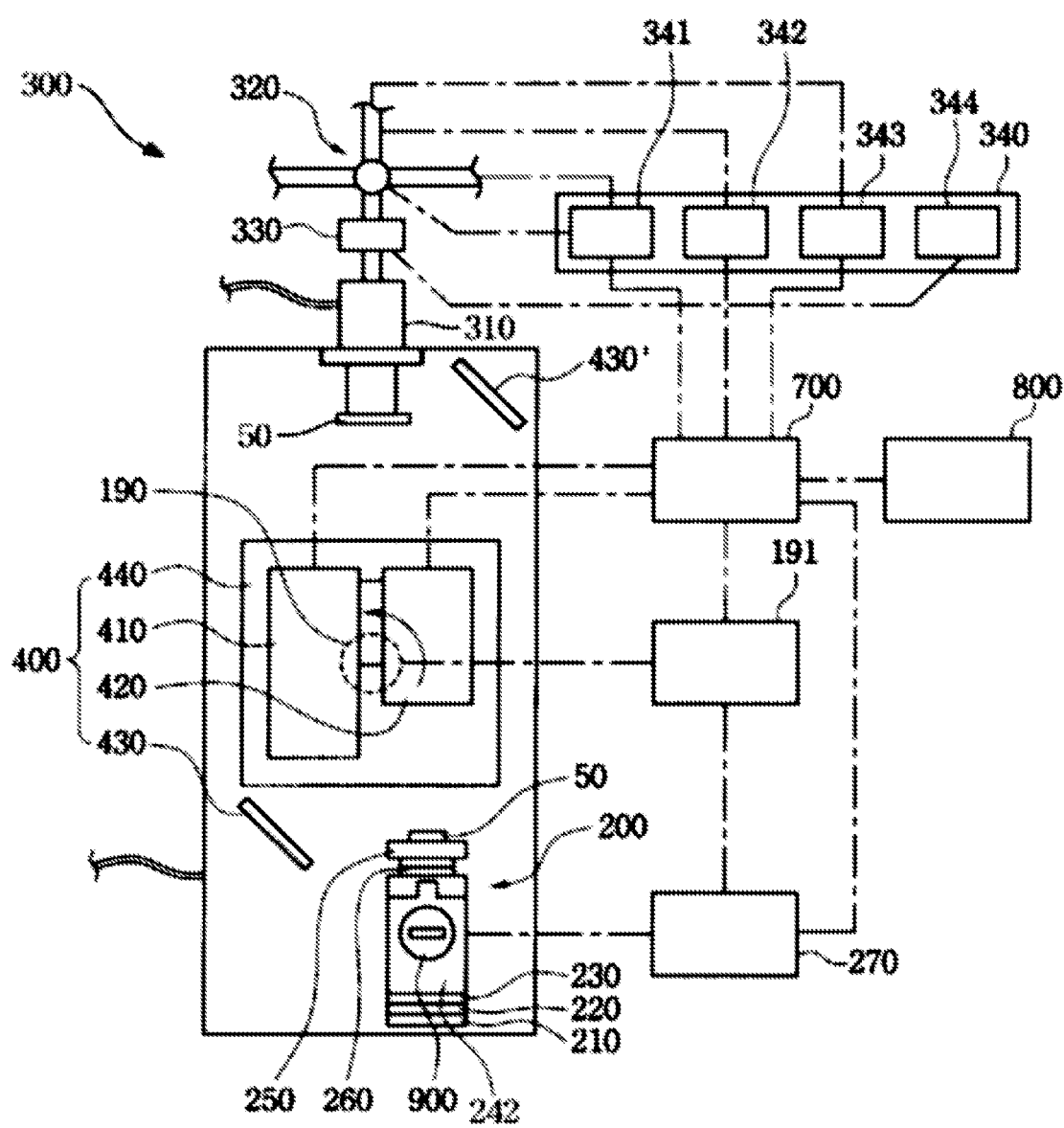
FIG. 11 is a view of the exemplary apparatus for recognizing and processing information of electronic parts of FIG. 10 in which the part information processing unit is rotated relative to FIG. 10.
Figure 12:
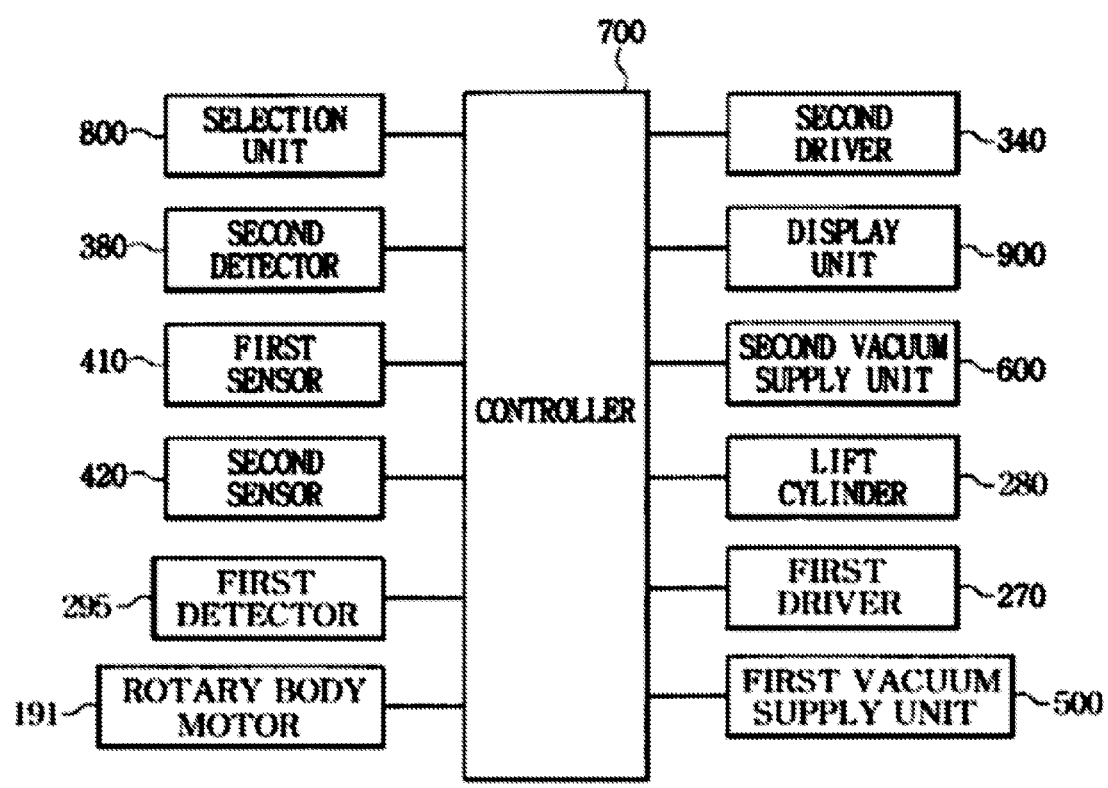
FIG. 12 is a block diagram showing an exemplary operational relationship between the sub seating unit and the part information processing unit of FIGS. 10 and 11.

FIG. 10 is a view of another exemplary apparatus for recognizing and processing information of electronic parts, FIG. 11 is a view of the exemplary apparatus for recognizing and processing information of electronic parts of FIG. 10 in which the part information processing unit is rotated relative to FIG. 10, and FIG. 12 is a block diagram showing an exemplary operational relationship between the sub seating unit and the part information processing unit of FIGS. 10 and 11.

The exemplary apparatus for recognizing and processing information of electronic parts shown in FIG. 10 includes a main body 100 having a plurality of seating units, each of which may be configured to grasp or seat an electronic part, and a part information processing unit configured to operate in conjunction with a selected one of the plurality of seating units to obtain part information of the electronic part grasped or seated by the selected seating unit. In the exemplary apparatus illustrated, the plurality of seating units includes a main seating unit 200 disposed at a lower portion of the main body 100 and configured to seat an electronic part 50 thereon, and a sub seating unit 300 disposed at an upper portion of the main body 100 and which also may be configured to seat or grasp an electronic part 50. The main body 100 may also include a part information processing unit 400 disposed between the main seating unit 200 and the sub seating unit 300 and a rotary body 190. The rotary body 190 may be connected to the part information processing unit 400 and be configured to rotate the part information processing unit 400 to be directed toward either the main seating unit 200 or the sub seating unit 300. The part information processing unit 400 may also be configured to recognize a single or a plurality of recognition surfaces of the electronic part 50 when seated on either of the main seating units 200 or the sub seating unit 300 and obtain part information of the recognized surface to store the obtained part information. In various embodiments, other means for positioning the part information processing unit to be operationally coupled with any selected one of the plurality of seating units may be employed, such as a sliding plate installed on a guide rail, an X-Y-Z position mover, or other motive bodies or mechanical positioning means as known to one skilled in the art.

The part information processing unit 400 may further include an installation body 440 connected to the rotary body 190. A first sensor 410 configured to obtain first part information of a plane recognition surface S1 of the electronic part 50 may be installed at the installation body 440. A second sensor 420 configured to obtain second part information of a side recognition surface S2 of the electronic part 50 may be installed to a side of the first sensor 410 at the installation body 440.

The main seating unit 200, the sub seating unit 300, and the part information processing unit 400 may be electrically connected to or communicatively coupled with a controller 700. As illustrated in FIG. 12, the controller 700 may also be electrically connected to or communicatively coupled with a selection unit 800, a first detector 295, a second detector 380, the first sensor 410, the second sensor 420, the rotary body motor 191, the first driver 270, the second driver 340, the display unit 900, the first vacuum supply unit 500, the second vacuum supply unit 600, and the lift cylinder 280. The selection unit 800 may be configured to generate and transmit a signal (e.g., an electrical signal) to the controller 700 which represents a selection of either the main seating unit 200 or the sub seating unit 300 to be used to obtain part information of the electronic part 50. Then, the controller 700 may select either the main seating unit 200 or the sub seating unit 300 according to the signal received from the selection unit 800.

The controller 700 may control rotation of the rotary body 190 such that the first and second sensors 410 and 420 are directed to either the main seating unit 200 or the sub seating unit 300, depending on the selection. The rotary body 190 may be connected to a rotary body motor 191 having a motor shaft and configured to rotate the rotary body 190 in response to a command signal (e.g., electrical signal) received from the controller 700. The controller 700 may also receive the first part information and the second part information of the electronic part 50 from the first and second sensors 410 and 420, collect the first and second part information as single part information, and group and store the collected part information.

When the main seating unit 200 is selected by the selection unit 800, the controller 700 may cause the rotary body 190 to rotate such that the first and second sensors 410 and 420 are directed to upper surfaces of the main seating unit 200 and the part seating plate 250. Accordingly, the first sensor 410 may be positioned to focus on the part seating plate 250, and the second sensor 420 may be positioned to form an image exposure path through a side portion of the part seating plate 250 and a reflection mirror 430. The controller 700 may then operate a first driver 270 such that the first sensor 410's focus of the plane recognition surface S1 and the second sensor 420's focus of the side recognition surface S2 correspond to a predetermined focus. Furthermore, the controller 700 may operate the first driver 270 such that a seating position of the electronic part 50 corresponds to a predetermined alignment position. The first and second sensors 410 and 420 may then obtain the first and second part information of the electronic part 50 seated on the upper surface of the part seating plate 250 and transmit the part information to the controller 700.

When the selection unit 800 selects the sub seating unit 300, as shown in FIG. 11, the controller 700 may cause the rotary body 190 to rotate such that the first and second sensors 410 and 420 are directed to a lower surface of the vacuum suction nozzle 310 of the sub seating unit 300. Accordingly, the first sensor 410 may be positioned to focus at a lower part of the vacuum suction nozzle 310, and the second sensor 420 may be positioned to form an image exposure path through a side portion of the vacuum suction nozzle 310 and a reflection mirror 430'. The controller 700 may then operate the second driver 340 such that the first sensor 410's focus of the plane recognition surface S1 and the second sensor 420's focus of the side recognition surface S2 of an electronic part 50 which may be grasped by the vacuum suction nozzle 310 correspond to a predetermined focus. Furthermore, the controller 700 may operate the second driver 340 such that a seating position of the electronic part 50 which may be grasped by the vacuum suction nozzle 310 corresponds to a predetermined alignment position. The first and second sensors 410 and 420 may then obtain the first and second part information of the electronic part 50 seated on the lower surface of the vacuum suction nozzle 310 and transmit the part information to the controller 700.

In various embodiments, the main seating unit 200 and the sub seating unit 300 described herein may be employed in conjunction with a part mounter such as a component or chip mounter (not shown). In these embodiments, the controller 700 may be electrically connected to or communicatively coupled with a controller (not shown) of the part mounter and the electronic part information grouped by the controller 700 may be transmitted to the controller of the part mounter and stored therein. Accordingly, information of an electronic part inserted into the part mounter may be previously determined by the part mounter's controller such that the electronic part may be conveyed to a mounting position of a printed circuit board and be readily mounted thereon. The plane part information and the side part information of the electronic part, such as size and thickness, may be used by the part mounter to align the electronic part when mounting the electronic part on the printed circuit board.

The part information processing unit 400 may include an application specific integrated circuit (ASIC), field programmable gate array (FPGA), or a computing processor configured to execute computing instructions to perform a method for recognizing and processing information of electronic parts as described herein. The computing instructions may be stored on a computer readable storage medium. The computer readable storage medium may include a magnetic storage medium such as a floppy disk or a hard disk, an optical storage medium such as a CD-ROM or DVD-ROM, an integrated circuit such as a ROM, EPROM, RAM, flash memory, or non-volatile memory. A method for recognizing and processing information of electronic parts as described herein may also be performed using logic implemented in an electronic circuit.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, these descriptions and drawings should not be considered in a limiting sense, as it is understood that the present invention is in no way limited to only the embodiments illustrated. It will be recognized that the terms "comprising," "including," and "having," as used herein, are specifically intended to be read as open-ended terms of art.

What is claimed is:

1. An apparatus for recognizing and processing information of electronic parts comprising:
    a seating unit configured to seat and align an electronic part thereon; and
    a part information processing unit disposed adjacent to the seating unit, the part information processing unit configured to
    align the electronic part using the seating unit,
    recognize a recognition surface of the electronic part,
    obtain part information of the recognized surface, and
    store the obtained part information.

2. The apparatus for recognizing and processing information of electronic parts according to claim 1,
    wherein the recognition surface includes
        a plane recognition surface representing a size of an upper or lower surface of the electronic part, and
        a side recognition surface representing a side thickness of the electronic part; and
    wherein the part information processing unit comprises:
        a first sensor disposed adjacent to the seating unit on which the electronic part is seated and aligned, the first sensor configured to obtain first part information of the plane recognition surface,
        a second sensor disposed adjacent to the seating unit on which the electronic part is seated and aligned, the second sensor configured to obtain second part information of the side recognition surface, and
        a controller configured to
            receive the first and second part information from the first and second sensors,
            collect the first and second part information, and
            group and store the collected first and second part information.

3. The apparatus for recognizing and processing information of electronic parts according to claim 2, wherein the controller is further configured to
    receive the first and second part information from the first and second sensors for a plurality of electronic parts at different times,
    calculate an average of the first and second part information of the plurality of electronic parts,
    collect the averaged first and second part information of the plurality of electronic parts, and
    group and store the collected averaged first and second part information.

4. The apparatus for recognizing and processing information of electronic parts according to claim 3, wherein the controller is further configured to
    compare the first and second part information of the plurality of electronic parts to determine whether the first and second part information corresponding to one of the plurality of electronic parts is the same as the first and second part information corresponding to another of the plurality of electronic parts or not within a reference error range, and
group the first and second part information of the plurality of electronic parts according to the comparison.

5. The apparatus for recognizing and processing information of electronic parts according to claim 2, wherein the controller is communicatively coupled with a display unit and configured to externally display the obtained first and second part information.

6. An apparatus for recognizing and processing information of electronic parts comprising:
a seating unit configured to seat and align an electronic part thereon, the seating unit comprising
a support plate having an X-axis guide rail,
an X-axis adjustment plate installed on the support plate and having
an X-axis guide groove fitted onto the X-axis guide rail and
a Y-axis guide rail formed at an upper end of the X-axis adjustment plate,
the X-axis adjustment plate configured to slide along an X-axis,
a Y-axis adjustment plate installed on the X-axis adjustment plate and having
a Y-axis guide groove fitted onto the Y-axis guide rail,
the Y-axis adjustment plate configured to slide along a Y-axis,
a vertical support body installed on the Y-axis adjustment plate,
a Z-axis adjustment plate configured to vertically slide along a Z-axis at a side of the vertical support body,
a part seating plate disposed at an upper end of the Z-axis adjustment plate and configured to rotate about the Z-axis, and
a first rotary shaft disposed between the part seating plate and the Z-axis adjustment plate and configured to rotate the part seating plate; and
a part information processing unit disposed adjacent to the seating unit, the part information processing unit comprising
a first sensor disposed adjacent to the seating unit on which the electronic part is seated and aligned, the first sensor configured to recognize a plane recognition surface of the electronic part seated on the part seating plate and obtain first part information thereof, the plane recognition surface representing a size of an upper or lower surface of the electronic part,
a second sensor disposed adjacent to the seating unit on which the electronic part is seated and aligned, the second sensor configured to recognize a side recognition surface of the electronic part seated on the part seating plate and obtain second part information thereof, the side recognition surface representing a side thickness of the electronic part, and
a controller configured to
align the electronic part using the seating unit,
receive the first and second part information from the first and second sensors,
collect the first and second part information, and
group and store the collected first and second part information.

7. The apparatus for recognizing and processing information of electronic parts according to claim 6, wherein the part seating plate comprises:
a main part seating plate body having a seating groove of a predetermined depth,
a sub part seating plate body seated on the seating groove,
a lift pin connected to a lower surface of the sub part seating plate body and passing through the main part seating plate body, and
a lift cylinder configured to receive an operation signal from the controller and lift the lift pin in response to the operation signal such that
the first sensor's focus of the recognized plane recognition surface corresponds to a predetermined focus, and
a seating position of the electronic part corresponds to a predetermined alignment position.

8. The apparatus for recognizing and processing information of electronic parts according to claim 6,
wherein the seating unit comprises a first driver communicatively coupled with the controller and configured to
receive an operation signal from the controller,
vary a position of the X-, Y-, and Z-axis adjustment plates in response to the operation signal, and
rotate the first rotary shaft in response to the operation signal, and
wherein the controller is further configured to operate the first driver such that
the first sensor's focus of the recognized plane recognition surface corresponds to a predetermined focus,
the second sensor's focus of the recognized side recognition surface corresponds to a predetermined focus, and
a seating position of the electronic part corresponds to a predetermined alignment position.

9. The apparatus for recognizing and processing information of electronic parts according to claim 8,
wherein the part seating plate further comprises a first detector configured to:
detect seating of the electronic part and
transmit a signal representative of the seating to the controller, and
wherein the controller is further configured to transmit the operation signal to the first driver in response to the signal representative of the seating received from the first detector.

10. The apparatus for recognizing and processing information of electronic parts according to claim 6,
wherein the seating unit further comprises
a vacuum suction nozzle having a vacuum suction orifice configured to use vacuum suction provided by an external vacuum supply to grasp the electronic part,
an X-Y-Z position mover configured to vary a position of the vacuum suction nozzle along X-, Y-, and Z-axes, and
a second rotary shaft installed between the vacuum suction nozzle and the X-Y-Z position mover, the second rotary shaft configured to rotate the vacuum suction nozzle; and
wherein the controller is further configured to vary a position of the X-Y-Z position mover and rotate the second rotary shaft to seat the electronic part on the seating unit.

11. An apparatus for recognizing and processing information of electronic parts comprising:
a seating unit including
a vacuum suction nozzle having a vacuum suction orifice configured to use vacuum suction provided by an external vacuum supply to grasp an electronic part,
an X-Y-Z position mover configured to vary a position of the vacuum suction nozzle along X-, Y-, and Z-axes, a rotary shaft installed between the vacuum suction nozzle and the X-Y-Z position mover and configured to rotate the vacuum suction nozzle, and a driver configured to
vary a position of the X-Y-Z position mover and rotate the rotary shaft; and a part information processing unit disposed in operational proximity to the seating unit, the part information processing unit configured to
recognize a recognition surface of the electronic part seated on the seating unit,
obtain part information of the recognized surface, and
store the obtained part information.

12. The apparatus for recognizing and processing information of electronic parts according to claim 11,
wherein the recognition surface includes
a plane recognition surface representing a size of an upper or lower surface of the electronic part, and
a side recognition surface representing a side thickness of the electronic part; and
wherein the part information processing unit comprises
a first sensor disposed in operational proximity to the vacuum suction nozzle by which the electronic part is grasped, the first sensor configured to obtain first part information of the plane recognition surface,
a second sensor disposed to a side of the first sensor and in operational proximity to the vacuum suction nozzle by which the electronic part is grasped, the second sensor configured to obtain second part information of the side recognition surface, and
a controller configured to
receive the first and second part information from the first and second sensors,
collect the first and second part information, and
group and store the collected first and second part information.

13. An apparatus for recognizing and processing information of electronic parts comprising:
a plurality of seating units, each of the plurality of seating units configured to seat an electronic part thereon;
a part information processing unit disposed in operational proximity to the plurality of seating units and configured to
recognize a recognition surface of the electronic part seated on a selected one of the plurality of seating units,
obtain part information of the recognized surface, and
store the obtained part information; and
a rotary body connected to the part information processing unit and configured to rotate the part information processing unit to be operationally coupled with the selected one of the plurality of seating units.

14. The apparatus for recognizing and processing information of electronic parts according to claim 13, wherein the plurality of seating units comprise:
a main seating unit including
a support plate having an X-axis guide rail;
an X-axis adjustment plate installed on the support plate and configured to slide along an X-axis, the X-axis adjustment plate having
an X-axis guide groove fitted onto the X-axis guide rail and
a Y-axis guide rail formed at an upper end of the X-axis adjustment plate;
a Y-axis adjustment plate installed on the X-axis adjustment plate and configured to slide along a Y-axis, the Y-axis adjustment plate having a Y-axis guide groove fitted onto the Y-axis guide rail;
a vertical support body installed on the Y-axis adjustment plate;
a Z-axis adjustment plate vertically slidable along a Z-axis at one side of the vertical support body;
a part seating plate disposed at an upper end of the Z-axis adjustment plate, the part seating plate rotatable about the Z-axis;
a first rotary shaft disposed between the part seating plate and the Z-axis adjustment plate, the first rotary shaft configured to rotate the part seating plate; and
a first driver configured to
vary a position of at least one of the X-, Y-, and Z-axis adjustment plates, and
rotate the first rotary shaft; and
a sub seating unit including
a vacuum suction nozzle having a vacuum suction orifice configured to use vacuum suction provided by an external vacuum supply to grasp the electronic part;
an X-Y-Z position mover configured to vary a position of the vacuum suction nozzle along X-, Y-, and Z-axes;
a second rotary shaft installed between the vacuum suction nozzle and the X-Y-Z position mover and configured to rotate the vacuum suction nozzle; and
a second driver configured to
vary a position of the X-Y-Z position, and
rotate the second rotary shaft.

15. The apparatus for recognizing and processing information of electronic parts according to claim 14,
wherein the recognition surface includes
a plane recognition surface representing a size of an upper or lower surface of the electronic part, and
a side recognition surface representing a side thickness of the electronic part; and
wherein the part information processing unit comprises
an installation body connected to the rotary body,
a first sensor disposed at the installation body and configured to obtain first part information of the plane recognition surface,
a second sensor disposed at the installation body and configured to be positioned to a side of the first sensor and obtain second part information of the side recognition surface,
a selection unit for selecting one of the main seating unit and the sub seating unit, and
a controller configured to
receive the first and second part information from the first and second sensors,
collect the first and second part information,
group and store the collected first and second part information, and
control rotation of the rotary body to direct the first and second sensors toward the selected seating unit such that the first and second sensors are in operational proximity therewith.

16. The apparatus for recognizing and processing information of electronic parts according to claim 15, wherein,
when the main seating unit is selected,
the first sensor is disposed to receive an image of the plane recognition surface of the electronic part seated on the part seating plate,
the second sensor is disposed to receive an image of the side recognition surface of the electronic part seated on the part seating plate, and
the controller operates the first driver such that a focus of the recognized plane recognition surface and side recognition surface corresponds to a predetermined focus and a seating position of the electronic part corresponds to a predetermined alignment position; and when the sub seating unit is selected,
the first sensor is disposed under the vacuum suction nozzle to receive an image of the plane recognition surface of the electronic part,
the second sensor is disposed to a side of the vacuum suction nozzle to receive an image of the side recognition surface of the electronic part, and
the controller operates the second driver such that a focus of the recognized plane recognition surface and side recognition surface corresponds to a predetermined focus and a seating position of the electronic part corresponds to a predetermined alignment position.

17. The apparatus for recognizing and processing information of electronic parts according to claim 15, wherein the part seating plate comprises:
a main part seating plate body having a seating groove of a predetermined depth,
a sub part seating plate body seated on the seating groove,
a lift pin connected to a lower surface of the sub part seating plate body and passing through the main part seating plate body, and
a lift cylinder configured to receive an operation signal from the controller and in response thereto, lift the lift pin such that a focus of the recognized plane recognition surface corresponds to a predetermined focus and a seating position of the electronic part corresponds to a predetermined alignment position.

18. The apparatus for recognizing and processing information of electronic parts according to claim 17,
wherein the part seating plate further comprises
a first detector configured to
detect seating of the electronic part and
transmit a signal representative of the seating to the controller, and
wherein the controller is further configured to transmit the operation signal to the first driver in response to the signal representative of the seating received from the first detector.

19. The apparatus for recognizing and processing information of electronic parts according to claim 17,
wherein the vacuum suction nozzle further comprises a second detector configured to detect vacuum suction of the electronic part and transmit a signal representative of the vacuum suction to the controller, and
wherein the controller is further configured to transmit the operation signal to the second driver in response to the signal representative of the vacuum suction received from the second detector.

20. The apparatus for recognizing and processing information of electronic parts according to claim 15, wherein the controller is further configured to
receive the first and second part information from the first and second sensors for a plurality of electronic parts at different times,
calculate an average of the first and second part information of the plurality of electronic parts,
collect the averaged first and second part information of the plurality of electronic parts,
group and store the collected part information,
compare the first and second part information of the plurality of electronic parts to determine whether the first and second part information corresponding to one of the plurality of electronic parts is the same as the first and second part information corresponding to another of the plurality of electronic parts or not within a reference error range,
group the first and second part information of the plurality of electronic parts according to the comparison and
display the obtained first and second part information to a display unit with which the controller is communicatively coupled.

* * * * *